US008416006B1

(12) United States Patent
Timonen et al.

(10) Patent No.: US 8,416,006 B1
(45) Date of Patent: Apr. 9, 2013

(54) ELECTRONIC DEVICE WITH GATE DRIVER FOR HIGH VOLTAGE LEVEL SHIFTER

(75) Inventors: Juha S. Timonen, Freising (DE); Carsten I. Stoerk, Freising (DE)

(73) Assignee: Texas Instruments Deutschland GmbH, Freising (DE)

( * ) Notice: Subject to any disclaimer, the term of this patent is extended or adjusted under 35 U.S.C. 154(b) by 0 days.

(21) Appl. No.: 13/298,092

(22) Filed: Nov. 16, 2011

(51) Int. Cl.
*H03L 5/00* (2006.01)

(52) U.S. Cl.
USPC .............................. 327/333; 327/108; 326/81

(58) Field of Classification Search .................. 327/108, 327/112, 333, 427; 326/68, 80, 81, 83, 87; 365/189.11
See application file for complete search history.

(56) References Cited

U.S. PATENT DOCUMENTS

| | | | | |
|---|---|---|---|---|
| 6,140,846 | A * | 10/2000 | Chan et al. | 327/108 |
| 2005/0184768 | A1 * | 8/2005 | Pilling et al. | 327/112 |
| 2010/0264958 | A1 * | 10/2010 | Nakamura et al. | 327/333 |

OTHER PUBLICATIONS

U.S. Appl. No. 13/289,867, filed Nov. 4, 2011.

* cited by examiner

*Primary Examiner* — Long Nguyen
(74) *Attorney, Agent, or Firm* — William B. Kempler; Wade J. Brady, III; Frederick J. Telecky, Jr.

(57) ABSTRACT

An electronic device comprising a level shifter for performing a voltage shift of a low level input signal of a first voltage domain to a high level output signal of a second voltage domain, the level shifter having a high-side transistor in series with a low-side transistor so as to provide an output node between the channel of the high-side transistor and the channel of the low-side transistor for driving a load with the high level output signal of the second voltage domain. The level shifter being configured to have a first state in which the high-side transistor is conducting and the low-side transistor is not conducting, a second state in which the low-side transistor is conducting and the high-side transistor is not conducting and a third state in which the high-side transistor is not conducting and the low-side transistor is not conducting.

20 Claims, 3 Drawing Sheets

ELECTRONIC DEVICE WITH GATE DRIVER FOR HIGH VOLTAGE LEVEL SHIFTER

FIELD OF THE INVENTION

The invention relates to an electronic device comprising a level shifter for performing a voltage shift of a low level input signal of a first voltage domain to a high level output signal of a second voltage domain.

BACKGROUND OF THE INVENTION

Level shifters are frequently used for shifting the low and high levels of a digital signal output from one part of a system to different low and high levels required by another part of the same system.

One of the technical fields in which level shifters are required is the field of Liquid Crystal Displays (LCD). Level shifters must here transform the logic levels of the control signals of a timing controller providing for example a difference between low and high voltage level of less than 5 V into positive and negative drive signals of an appropriate level which depends on a particular LCD display and can reach several tens of volts. Present-generation LCDs using amorphous silicon gates (ASG), also called Gate-in-Panel (GIP) or Gate-On-Array (GOA) need drive voltages between about 20 V to 40 V for the high level and between about −5 V to −20 V for the low level resulting in a voltage difference from 25 V up to 60 V.

FIG. 1 shows simplified circuit and block diagram of an electronic device 1 according to the prior art. The electronic device comprises a control logic 2, two gate drivers 3 and 4 for driving the gates of transistors (MOSFETs) Q9 and Q10. In this example, transistors Q9 and Q10 are both PMOS transistors. Transistor Q9 is also referred to as the high-side transistor and transistor Q10 is also referred to as the low-side transistor. The source of transistor Q9 is coupled to a relatively high supply voltage level VGH (up to 40 V and more). The drain of transistor Q9 is coupled to the source of transistor Q10 at node VGHM. Node VGHM is the driving node which can be coupled to a capacitive load (not shown), as for example an LCD display. The drain of transistor Q10 is coupled to a resistor RE. The resistor RE serves to define a specific slope of the current through Q10 and is dimensioned in accordance with the requirements of the target application. The control logic 2 receives a signal GVOFF that varies between voltage levels of a low supply voltage domain (for example between 0 V and 5 V) and provides driving control signals DR9 and DR10 (comprising Q10ON, Q10OFF) to the driving stage 3 and 4. Driving stage 3 is also referred to as high-side driving stage and driving stage 4 is also referred to as low-side driving stage. Driving control signals DR9 and DR10 have the voltage levels of the low supply voltage domain. Driving Pin VGHM is supposed to drive a load with voltage levels up to 40 V or more, i.e. with voltage levels of the high supply voltage domain. The gate drivers 3 and 4 are coupled to the control gates of transistors Q9 and Q10. The gate control signals G9 and G10 have to be configured such that transistors Q9 and Q10 can be completely turned on and off. This creates various problems with respect to the timing and the voltage levels that are required from control signals G9 and G10.

FIG. 2 shows a simplified circuit diagram of a prior art circuit that is used for driving the gate of the transistor Q10. The channels of transistors Q9 and Q10 are coupled in series as shown in FIG. 1. High-side transistor Q9 is coupled between the driving node VGHM and the high supply voltage VGH. Low-side Q10 is coupled with its channel between node VGHM and node to which the resistor RE (not shown) can be coupled. The high-side gate driving stage for transistor Q9 is not shown as this gate driver is less critical. There is a low-side gate driver (corresponding to driving stage 4 in FIG. 1) that comprises transistors M0 to M5, an overstress protection diode D0 and a bias current source 12. Transistors M1, M2, M4 and M5 are PMOS transistors. Transistors M0 and M3 are NMOS transistors. The control gates of transistors M0 and M3 receive control signals Q10ON and Q10OFF, respectively. The control signals are provided by control stage 2 (as shown in FIG. 1). The sources of transistors M0 and M3 are coupled to ground. The drain of transistor M0 is coupled to the drain of transistor M2. The drain of transistor M3 is coupled to the drain of transistor M1. The gates of transistors M2 and M1 are coupled together and to one side of the bias current source 12 and the anode of Zener diode D0. The other side of bias current source 12 is coupled to ground. The Zener diode D0 is further coupled with its cathode to node VGHM. The source of transistor M2 is coupled to the drain of transistor M4, to the gate of transistor M5 and to the gate of transistor Q10. Accordingly, this node provides the control signal G10 for the gate of transistor Q10. The source of transistor M1 is coupled to the drain of transistor M5 and to the gate of transistor M4. The sources of transistors M4 and M5 are coupled to node VGHM. Transistors M4 and M5 are cross-coupled so as to ensure that the control signal G10 is always in a stable state. In response to signals Q10OFF and Q10ON, node G10 (i.e. control signal G10) is either pulled to the voltage level at node VGHM or to ground. If, for example Q10ON is high (greater than the threshold voltage level of M0) and Q10OFF is low (lower than the threshold voltage level of M3), node G10 is pulled to ground. Transistor Q10 is turned on provided that the voltage level at VGHM is high enough. If signal Q10ON is low (lower than the threshold voltage level of M0) and Q10OFF is high (higher than the threshold voltage level of M3), node G10 is pulled to VGHM. Transistor Q10 is then turned off. However, if node VGHM is discharged to ground level, this can cause shoot through current through transistors Q9 and Q10 and resistor RE at the beginning of a new pulse. This shoot through current is due to the fact that VGHM needs to exceed at least one threshold voltage level VT before the gate driving stage 4 can react and turn off transistor Q10.

This problem was addressed with capacitive bootstrap circuits which were configured to raise the gate voltage of Q10 faster than through the voltage at node VGHM. However, these prior art circuits also failed to completely prevent shoot through current. Furthermore, the capacitive bootstrap circuit requires a comparatively large capacitor that is also suitable for the voltage levels in the high voltage domain. The area consumed by this capacitor is too large, if the gate drive is integrated in an integrated semiconductor device. If the ON-resistance of the low-side transistor Q10 has to be reduced, the gate capacitance of transistor Q10 increases. The prior art gate driving stage 3 may then not be able to charge control gate of Q10 fast enough. In some prior art solutions, this is overcome by coupling one or more inverters between the output node of the gate driving stage 3 and the control gate of Q10. However, in this prior art configuration it becomes difficult to supply the inverters properly between ground and VGHM in order not to violate the maximum gate-source and drain-source voltage limits of transistor in the inverters or of Q10. These circuits still suffer from some shoot through current.

Furthermore, there are target applications for level shifters where the voltage level at node VGHM should not drop below a predefined voltage level. This requirement can not be met with the previously described level shifters and gate drivers.

SUMMARY OF THE INVENTION

It is a general object of the invention to provide an electronic device with a level shifter having a gate driver that prevents shoot through current and allows a lower output voltage level to be set.

In an aspect of the invention, an electronic device is provided that comprises a level shifter for performing a voltage shift of a low level input signal of a first voltage domain to a high level output signal of a second voltage domain. The level shifter comprises a high-side transistor and a low-side transistor. The high-side transistor is coupled with a first side of its channel to the supply voltage level of the second voltage domain and with a second side of its channel to a first side of the low-side transistor so a to provide an output node between the channel of the high-side transistor and the channel of the low-side transistor for driving a load with the high level output signal of the second voltage domain. The level shifter further comprises a gate driving stage for the low-side transistor being coupled between the supply voltage level of the second supply voltage domain and ground. The gate driving stage can be configured to receive control signals having voltage levels of the first voltage domain and to control the gate of the low-side transistor. The level shifter is configured to have a first state in which the high-side transistor is conducting and the low-side transistor is not conducting, a second state in which the low-side transistor is conducting and the high-side transistor is not conducting and a third state in which the high-side transistor is not conducting and the low-side transistor is not conducting. The gate driving stage comprises a first control stage being configured to bias the control gate of the low-side switch in response to the voltage level at the output node for maintaining a first voltage difference between the output node and the control gate of the low-side switch. The first voltage difference can be set to be just large enough to keep the low-side switch not conducting in the third state. Advantageously, the first control stage is also supplied by the supply voltage of the second supply voltage domain. A level shifter with a gate driving stage for the low-side transistor that is configured in accordance with the previously described aspects of the invention, does not required large capacitors, does not suffer from shoot through current and can switch the low-side transistor on and off at high speed.

The first control stage keeps the voltage level at the control gate of the low-side transistor well below the supply voltage level of the second domain. This further prevents any discharging effects or undesired currents. The first voltage difference between gate and source of the low-side transistor can advantageously be about one threshold voltage level. This is enough to keep the low-side transistor safely off.

In an embodiment of the invention, a diode-coupled transistor may be provided for defining the first voltage difference. The diode-coupled transistor may then be coupled between the output node of the level shifter and a first input of a comparator or operational amplifier. The second input of the comparator or operational amplifier may then be coupled to the control gate of the low-side transistor. The output of the comparator or operational amplifier may then be coupled so as to control a current for charging the control gate of the low-side transistor. This is an efficient configuration of the first control stage.

The gate driving stage for the low-side transistor can further be configured to pull the voltage level at the control gate of the low-side transistor up to the supply voltage level of the second domain in the first state. This provides that the low-side transistor is completely turned off, while the output node is supplied through the high-side transistor. Furthermore, according to this aspect of the invention, it is not necessary to use the first control stage in the first state.

The gate driving stage can further comprise a second control stage that can be configured to maintain a second voltage difference between the output node and the control gate that is enough to keep the low-side switch conducting in the second state. This aspect of the invention provides that low-side transistor is reliably kept open in the second state, while the high-side transistor is turned off. The first voltage difference and the second voltage difference typically have different signs.

The first control stage may comprise a current path between a supply voltage node of the second domain and the control gate of the low-side switch for supplying current to the control gate of the low-side switch. The current path can advantageously be configured to provide a current that is large enough to drive the control gate of the low-side switch faster than the high-side switch can charge the output node in the first state. This further prevents any shoot through current.

BRIEF DESCRIPTION OF DRAWINGS

Further aspects of the invention will appear from the appending claims and from the following detailed description given with reference to the appending drawings.

DETAILED DESCRIPTION OF EXAMPLE EMBODIMENTS

Figure 3:
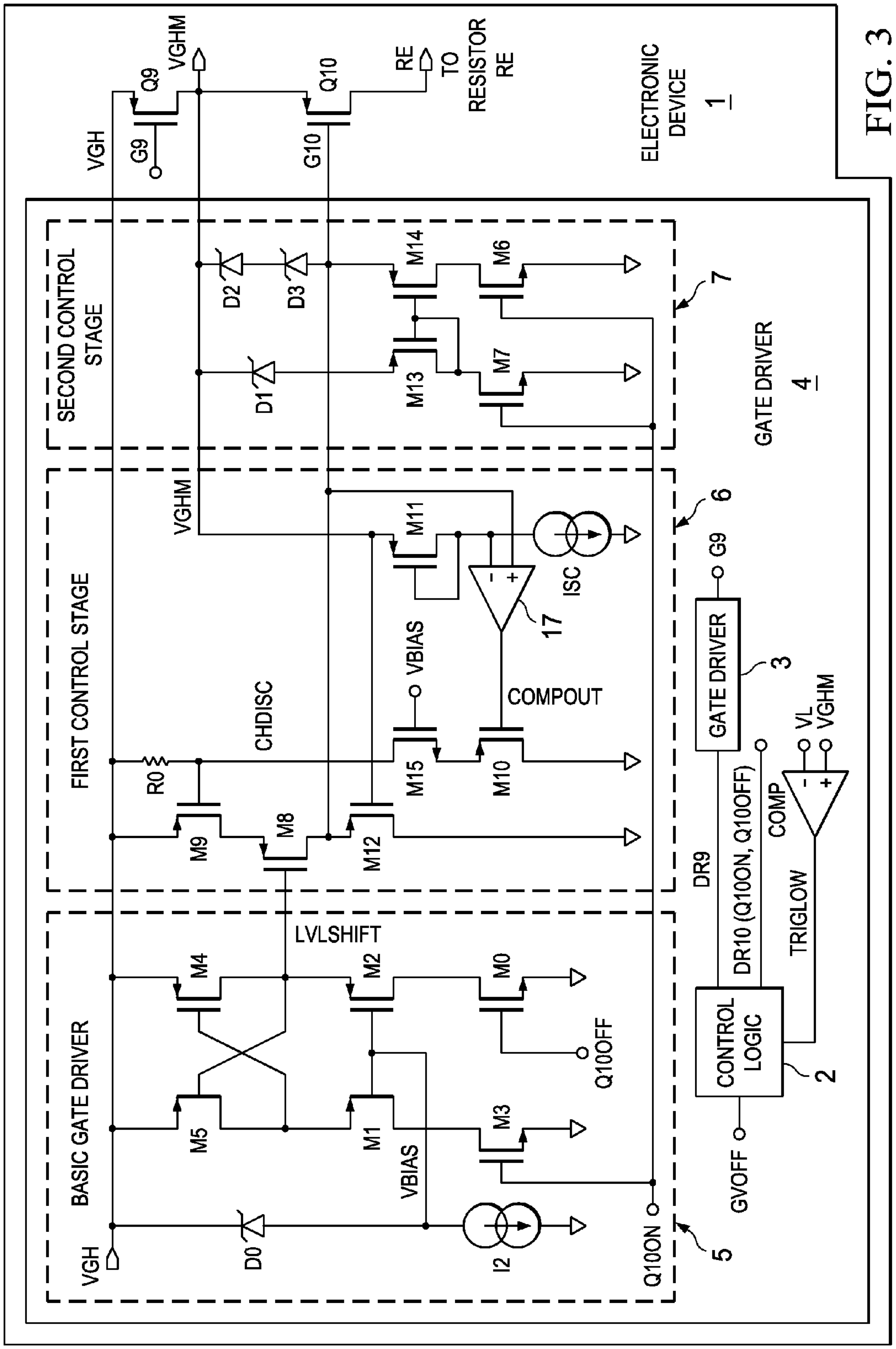
FIG. 3 shows an electronic device with a level shifter according to an embodiment of the invention.

FIG. 3 shows an electronic device with a level shifter according to an embodiment of the invention. The electronic device 1 comprises a control logic 2, two gate drivers 3 and 4 for driving the gates of transistors (MOSFETs) Q9 and Q10. In this embodiment, transistors Q9 and Q10 are both PMOS transistors. Transistor Q9 is the high-side transistor and transistor Q10 is the low-side transistor. The source of transistor Q9 is coupled to a relatively high supply voltage level VGH (up to 40 V and more). The drain of transistor Q9 is coupled to the source of transistor Q10 at node VGHM. Node VGHM is the driving node which can be coupled to a capacitive load (not shown), as for example an LCD display. The drain of transistor Q10 can be coupled to a resistor RE. The resistor RE can be used to define a specific slope of the current through Q10 and is dimensioned in accordance with the requirements of the target application. The control logic 2 receives a signal GVOFF that varies between voltage levels of a low supply voltage domain (for example between 0 V and 5 V) and provides driving control signals DR9 to driving stage 3 and driving signals DR10 (here these driving signals are Q10ON, Q10OFF) to the driving stage 4. Driving stage 3 is the high-side driving stage and driving stage 4 is the low-side driving stage. The low-side driving stage 4 is now implemented in accordance with the various aspects of the invention. Driving control signals DR9 and Q10ON, Q10OFF have the voltage levels of the low supply voltage domain. Driving node VGHM is supposed to drive a load with voltage levels up to 40 V or more, i.e. with voltage levels of the high supply voltage domain having high supply voltage level VGH. The gate drivers 3 and 4 are coupled to the control gates of transistors Q9 and Q10. The gate control signals G9 and G10 have to be configured such that transistors Q9 and Q10 can be completely turned on and off.

The channels of transistors Q9 and Q10 are coupled in series providing the output node VGHM between the channels. High-side transistor Q9 is coupled with its channel between the output node VGHM and the high supply voltage VGH of the second voltage domain. Low-side transistor Q10 is coupled with its channel between node VGHM and the node to which the resistor RE (not shown) can be coupled.

The high-side gate driving stage 3 for transistor Q9 is not shown in detail as this gate driver is less critical.

Figure 2:
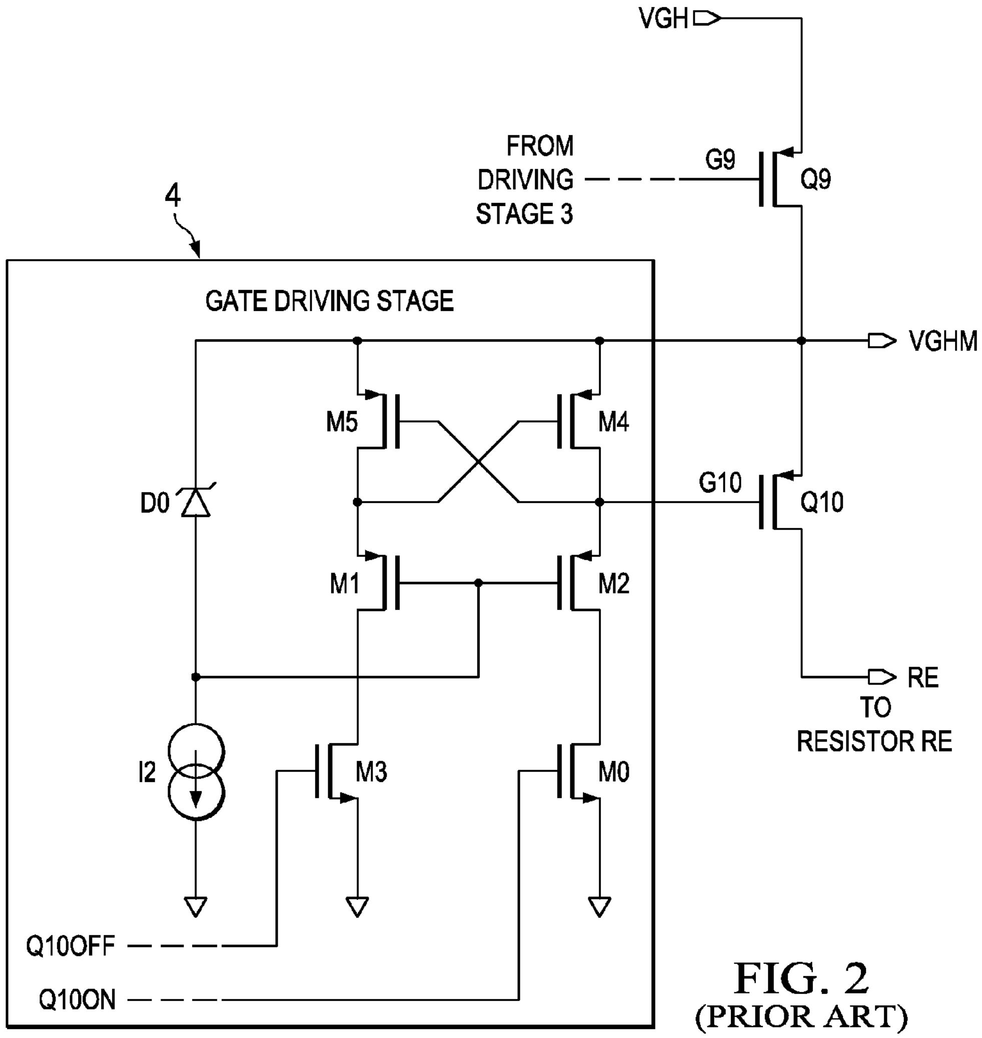
FIG. 2 (PRIOR ART)
FIG. 2 shows a circuit diagram of a part of the level shifter of FIG. 1 in more detail.

The low-side gate driving stage 4 is configured in accordance with aspects of the invention. The low-side gate driving stage 4 comprises three stages 5, 6 and 7. There is a basic gate driving stage 5 that is similar to the gate driving stage shown in FIG. 2. Furthermore, there is a first control stage 6 and a second control stage 7.

Figure 1:
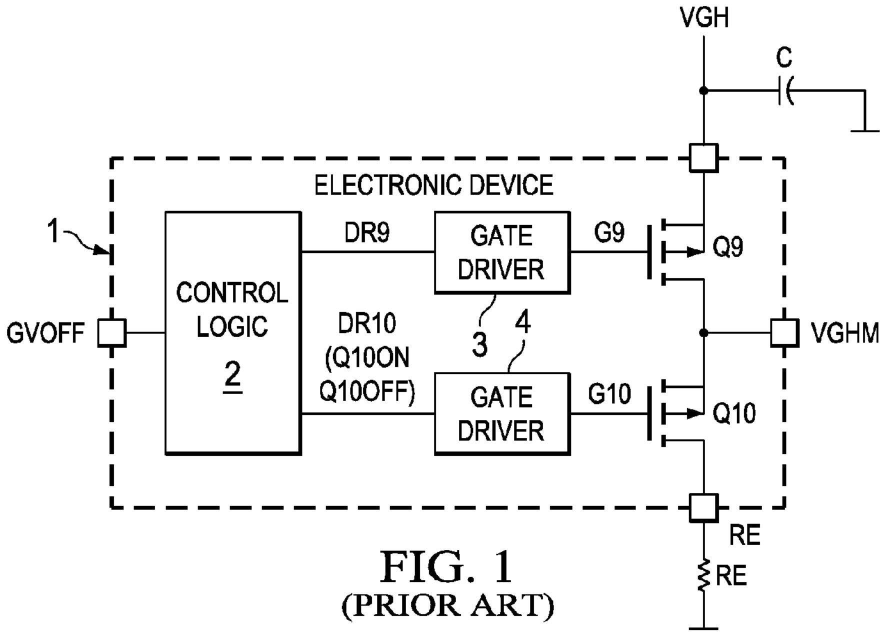
FIG. 1 (PRIOR ART)
FIG. 1 shows a simplified circuit and block diagram of a level shifter according to the prior art.

The basic gate driving stage 4 comprises transistors M0 to M5, an overstress protection diode D0 and a bias current source 12. Transistors M1, M2, M4 and M5 are PMOS transistors. Transistors M0 and M3 are NMOS transistors. The control gates of transistors M0 and M3 receive control signals Q10ON and Q10OFF, respectively. The control signals are provided by control stage 2 (as shown in FIG. 1). The sources of transistors M0 and M3 are coupled to ground. The drain of transistor M0 is coupled to the drain of transistor M2. The drain of transistor M3 is coupled to the drain of transistor M1. The gates of transistors M2 and M1 are coupled together and to one side of the bias current source 12 and the anode of Zener diode D0. The other side of bias current source 12 is coupled to ground. The Zener diode D0 is further coupled with its cathode to node VGH. The source of transistor M2 is coupled to the drain of transistor M4, to the gate of transistor M5 and to the gate of transistor M8.

The source of transistor M1 is coupled to the drain of transistor M5 and to the gate of transistor M4. The sources of transistors M4 and M5 are coupled to node VGH, i.e. to the supply voltage level of the second domain. This means that the gate driver 5 is supplied by the high supply voltage of the second voltage domain. Transistors M4 and M5 are cross-coupled so as to ensure that the control signal LVLSHIFT for transistor M8 is always in a stable state.

In response to signals Q10OFF and Q10ON, node LVLSHIFT is either pulled to the voltage level at node VGH or towards to ground. If, for example Q10ON is high (greater than the threshold voltage level of M3) and Q10OFF is low (lower than the threshold voltage level of M0), node LVLSHIFT is pulled to VGH. Transistor M8 is then turned off (not conducting).

If signal Q10ON is low (lower than the threshold voltage level of M3) and Q10OFF is high (higher than the threshold voltage level of M0), node LVLSHIFT is pulled to ground. Transistor M8 is then turned on (conducting).

The first control stage 6 comprises transistors M8, M9, M12, M15, M10, M11, resistor R0 and operational (differential) amplifier 17. Operational amplifier 17 is coupled with its positive input to node G10, which is the node at the control gate of low-side transistor Q10. The inverted (or negative) input of operational amplifier 17 is coupled to a one side of diode-coupled transistor M11. The other side of diode coupled transistor M11 is coupled to output node VGHM. There is also current source ISC that is coupled between the inverted input of operational amplifier 17 and ground for providing a current through diode coupled transistor M11. This results in a voltage drop across M11 that is one threshold voltage level. The operational amplifier 17 is supplied with a supply voltage of the first voltage domain (for example 5 V) The output of operational amplifier 17 is coupled to the control gate of transistor M10. The drain of transistor M10 is coupled to ground. The source of transistor M10 is coupled to the source of transistor M15. Transistor M15 receives an external bias signal VBIAS at the control gate. The drain of transistor M15 is coupled to one side of resistor R0. The other side of resistor R0 is coupled to the supply voltage VGH of the second domain. Transistor M12 is coupled with its drain to ground and with its source to the drain of transistor M8. The control gate of transistor M12 is coupled to the output node VGHM. The source of transistor M8 is coupled to the drain of transistor M9 and the source of transistor M9 is coupled to VGH. Transistor M15 is serves to protect transistor M10 from overvoltage. Otherwise, the current through R0, M10 and M15 is controlled by M10, which receives the output signal COMPOUT of operational amplifier 17.

The second control stage 7 comprises transistors M6, M7, M13, M14 and diodes D1, D2 and D3. The source of transistor M6 is coupled to ground. The drain of transistor M6 is coupled to the drain of transistor M14. The source of transistor M14 is coupled to the control gate of transistor Q10, i.e. to node G10. The cathode of diode D3 is coupled to node G10 and the anode of diode D3 is coupled to the anode of diode D2. The cathode of diode D2 is coupled to output node VGHM. The source of transistor M7 is coupled to ground. The drain of transistor M7 is coupled drain and gate of transistor M13. The source of transistor M13 is coupled to the anode of diode D1. The cathode of diode D1 is coupled to output node VGHM. Transistors M13 and M14 configured as a current mirror that mirrors the current through M13 to transistor M14.

Diodes D2 and D3 prevent overstress voltages between source and gate of low-side transistor Q10. Diode D1 (in combination with transistors M6, M7, M13 and M14) defines the voltage drop between gate (node G10) and source (node VGHM) of low-side transistor Q10 if transistors M6 and M7 are switched on (conducting).

The gate driver 5 in combination with the first control stage 6 and the second control stage 7 provides that the gate voltage at node G10 of transistor Q10 has the appropriate level in three different states of the level shifter.

In the first state, the low-side transistor Q10 is off (not conducting) and the high side transistor Q9 is turned on (conducting). Signal Q10OFF is then high and signal Q10ON is low. Transistors M3, M6 and M7 are switched off (not conducting) and transistor M0 is switched on. Accordingly, transistor M8 is also turned on. The voltage at output node VGHM rises up to the supply voltage level VGH of the second supply voltage domain. If Q9 is turned on (through signal G9 from the control stage), while low-side transistor Q10 is turned off, the rising voltage at node VGHM causes operational amplifier 17 to switch its output COMPOUT. Node CHDISC is pulled down and transistor M9 is turned on. Since transistor M8 is also turned on, a current is supplied from node VGH to the control gate G10 of low-side transistor Q10. The voltage at the control gate of transistor Q10 is pulled up to VGH. Diodes D2, and D3 protect transistor Q10 from a too large gate-source voltage while the gate of Q10 is pulled up to VGH. Transistors M8 and M9 are dimensioned such that the voltage level at the gate of low-side transistor Q10 can rise faster than the voltage at output node VGHM that is charged though high-side transistor Q9.

In the second state, low side transistor Q10 is switched on and high-side transistor Q9 is switched off. Signal G9 is then high, signal Q10ON is high and signal Q10OFF is low. This provides that transistors M6 and M7 are switched on, transistor M0 is switched off and transistor M3 is switched on. Transistor M8 is then switched off, which means that the current path from VGH to the control gate G10 of transistor Q10 is disconnected. The voltage at control gate G10 of Q10 now follows the voltage level at output node VGHM with a voltage difference with respect to VGHM that is defined by diode D1. This means that the second control stage 7 defines the gate source voltage of the low-side transistor Q10 thereby providing that Q10 remains conducting.

In this embodiment of the invention, a minimum voltage limit VL for VGHM can be set. There is a comparator (may be external of the electronic device or internal) that receives the lower threshold voltage at the negative (or positive) input and the output voltage VGHM at the positive (or negative) input. The comparator COMP changes its output signal TRIGLOW, if the lower voltage level is reached. The output signal TRIGLOW is fed to the control logic 2. If during the second state (Q10 on, Q9 off) the minimum voltage limit VL for VGHM is reached, the comparator COMP triggers the control logic 2 to change the control signals in order to switch the level shifter into the third state. The third state is a high impedance state in which the high-side transistor Q9 and the low-side transistor Q10 are switched off (not conducting). Signal G9 is then high (with respect to VGH, i.e. with respect to the voltage levels in the second voltage domain) and signals Q10ON and Q10OFF are low and high respectively. This provides that transistors M3, M6 and M7 are turned off and transistor M0 is turned on. Transistor M8 is turned on again and voltage level at node G10 (gate of Q10) rises. However, in the third state, the first control stage 6 monitors the voltage difference between output node VGHM and node G10, i.e. the first control stage 6 monitors the gate-source voltage of the low-side transistor Q10. If the voltage level at output node VGHM becomes more than a threshold level lower than the gate voltage level of Q10 at node G10, the operational amplifier 17 changes its output signal COMPOUT to high and turns transistor M10 off. This provides that transistor M9 also switches off and thereby prevents the voltage level of the control gate of Q10 at node G10 can rise further. Accordingly, control gate of low-side transistor Q10 is now continuously biased to have voltage level that is one threshold voltage level higher than the voltage level VGHM at the output node. The voltage difference between the source and the gate of Q10 is defined by transistor M11 which is diode-coupled and provides a voltage drop of one threshold level. This keeps low-side transistor Q10 off. If transistor M9 is not switched off, the voltage at node G10 could rise further (due to current supplied through M8 and M9 to node G10) and node VGHM can be charged through diodes D2 and D3. This additional charge can increase the voltage level at node VGHM, which should be prevented.

Transistor M12 serves as an additional security feature. M12 may have a rather high threshold voltage that can be higher than the threshold voltage of transistor M11. If a sudden voltage drop at output node VGHM occurs or the first control stage 6 is too slow, node G10 can be discharged through M12 in order to avoid over-voltage stress across transistor Q10.

Figure 4:
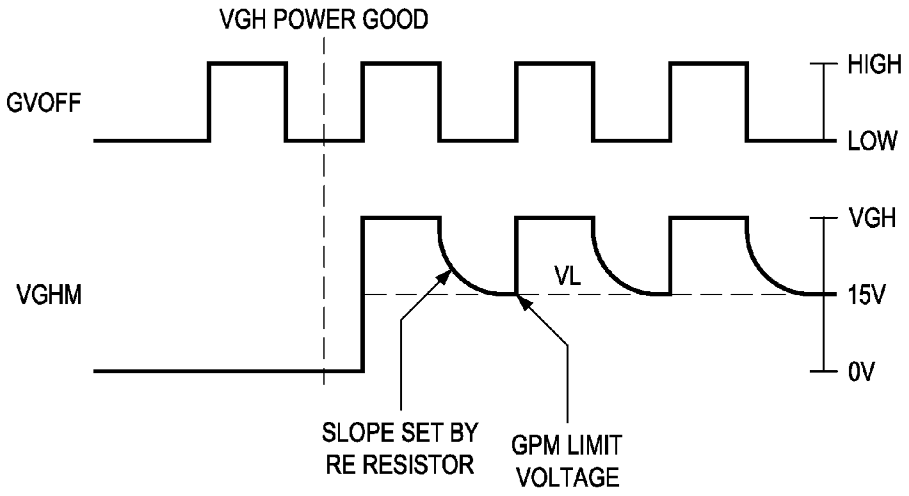
FIG. 4 shows signals relating to the embodiment of the invention shown in FIG. 3.

FIG. 4 shows a diagram of waveforms of the input signal VGOFF and output signal VGHM of the level shifter according to the invention. As soon as the supply voltage VGH of the second domain is high enough and stable the level shifter and the gate driver according to the invention starts working. If signal VGOFF rises, node VGHM is charged through high-side transistor Q9, while transistor Q10 is switched off (first state). When GVOFF switches from high to low, the level shifter assumes the second state, in which Q10 is turned on, and Q9 is turned off. The output node VGHM is discharged through transistor Q10 and a resistor RE defines the slope of the decreasing voltage. If the lower limit VL is reached, the level shifter assumes the third state, in which both transistors Q9 and Q10 are switched off, and the first control stage ensures that Q10 is remains off.

Although the invention has been described in detail, it should be understood that various changes, substitutions and alterations can be made thereto without departing from the spirit and scope of the invention as defined by the appended claims.

The invention claimed is:

1. An electronic device comprising a level shifter for performing a voltage shift of a low level input signal of a first voltage domain to a high level output signal of a second voltage domain, the level shifter comprising:

a high-side transistor and a low-side transistor, the high-side transistor being coupled with a first side of its channel to the supply voltage level of the second voltage domain and with a second side of its channel to a first side of the low-side transistor so as to provide an output node between the channel of the high-side transistor and the channel of the low-side transistor for driving a load with the high level output signal of the second voltage domain;

the level shifter being configured to have a first state in which the high-side transistor is conducting and the low-side transistor is not conducting, a second state in which the low-side transistor is conducting and the high-side transistor is not conducting and a third state in which the high-side transistor is not conducting and the low-side transistor is not conducting;

a gate driving stage being coupled between the supply voltage level of the second supply voltage domain and a reference voltage and configured to receive control signals having voltage levels of the first voltage domain and to control a control gate of the low-side transistor; and wherein the gate driving stage comprises a first control stage that is configured to bias in the third state the control gate of the low-side transistor in response to the voltage level at the output node for maintaining a first voltage difference between the output node and the control gate of the low-side transistor that is enough to keep the low-side transistor not conducting.

2. The electronic device of claim 1, wherein the first voltage difference is about one threshold voltage level of a MOSFET transistor.

3. The electronic device of claim 1, wherein, in the third state, the first control stage keeps the voltage level at the control gate of the low-side transistor well below the supply voltage level of the second domain.

4. The electronic device of claim 2, wherein, in the third state, the first control stage keeps the voltage level at the control gate of the low-side transistor well below the supply voltage level of the second domain.

5. The electronic device of claim 3, wherein, in the first state, the gate driving stage for the low-side transistor is configured to raise the voltage level at the control gate of the low-side transistor to the supply voltage level of the second domain.

6. The electronic device of claim 4, wherein, in the first state, the gate driving stage for the low-side transistor is configured to raise the voltage level at the control gate of the low-side transistor to the supply voltage level of the second domain.

7. The electronic device of claim 3, wherein, in the second state, the gate driving stage for the low-side transistor is further configured to maintain a second voltage difference between the output node and the control gate that is enough to keep the low-side transistor conducting.

8. The electronic device of claim 4, wherein, in the second state, the gate driving stage for the low-side transistor is further configured to maintain a second voltage difference between the output node and the control gate that is enough to keep the low-side transistor conducting.

9. The electronic device of claim 5, wherein, in the second state, the gate driving stage for the low-side transistor is further configured to maintain a second voltage difference between the output node and the control gate that is enough to keep the low-side transistor conducting.

10. The electronic device of claim 2, wherein the first control stage comprises a current path between a supply voltage node of the second domain and the control gate of the low-side transistor for supplying current to the control gate of the low-side transistor, wherein, in the first state, the current path is configured to provide a current that is large enough to drive the control gate of the low-side transistor faster than the high-side transistor charges the output node.

11. The electronic device of claim 3, wherein the first control stage comprises a current path between a supply voltage node of the second domain and the control gate of the low-side transistor for supplying current to the control gate of the low-side transistor, wherein, in the first state, the current path is configured to provide a current that is large enough to drive the control gate of the low-side transistor faster than the high-side transistor charges the output node.

12. The electronic device of claim 4, wherein the first control stage comprises a current path between a supply voltage node of the second domain and the control gate of the low-side transistor for supplying current to the control gate of the low-side transistor, wherein, in the first state, the current path is configured to provide a current that is large enough to drive the control gate of the low-side transistor faster than the high-side switch charges the output node.

13. The electronic device of claim 5, wherein the first control stage comprises a current path between a supply voltage node of the second domain and the control gate of the low-side transistor for supplying current to the control gate of the low-side transistor, wherein, in the first state, the current path is configured to provide a current that is large enough to drive the control gate of the low-side transistor faster than the high-side transistor charges the output node.

14. The electronic device of claim 6, wherein the first control stage comprises a current path between a supply voltage node of the second domain and the control gate of the low-side transistor for supplying current to the control gate of the low-side transistor, wherein, in the first state, the current path is configured to provide a current that is large enough to drive the control gate of the low-side transistor faster than the high-side transistor charges the output node.

15. The electronic device of claim 7, wherein the first control stage comprises a current path between a supply voltage node of the second domain and the control gate of the low-side transistor for supplying current to the control gate of the low-side transistor, wherein, in the first state, the current path is configured to provide a current that is large enough to drive the control gate of the low-side transistor faster than the high-side transistor charges the output node.

16. The electronic device of claim 8, wherein the first control stage comprises a current path between a supply voltage node of the second domain and the control gate of the low-side transistor for supplying current to the control gate of the low-side transistor, wherein, in the first state, the current path is configured to provide a current that is large enough to drive the control gate of the low-side transistor faster than the high-side transistor charges the output node.

17. The electronic device of claim 9, wherein the first control stage comprises a current path between a supply voltage node of the second domain and the control gate of the low-side transistor for supplying current to the control gate of the low-side transistor, wherein, in the first state, the current path is configured to provide a current that is large enough to drive the control gate of the low-side transistor faster than the high-side transistor charges the output node.

18. The electronic device of claim 1, wherein the output node is coupled to an LCD device.

19. The electronic device of claim 7, wherein the output node is coupled to an LCD device.

20. The electronic device of claim 17, wherein the output node is coupled to an LCD device.

* * * * *